(12) United States Patent
Gani

(10) Patent No.: US 9,793,427 B1
(45) Date of Patent: Oct. 17, 2017

(54) AIR VENTING ON PROXIMITY SENSOR

(71) Applicant: STMICROELECTRONICS PTE LTD, Singapore (SG)

(72) Inventor: David Gani, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 15/218,966

(22) Filed: Jul. 25, 2016

(51) Int. Cl.
| | |
|---|---|
| *H01L 27/15* | (2006.01) |
| *H01L 31/024* | (2014.01) |
| *H01L 31/173* | (2006.01) |
| *G01V 8/10* | (2006.01) |

(52) U.S. Cl.
CPC .............. *H01L 31/024* (2013.01); *G01V 8/10* (2013.01); *H01L 31/173* (2013.01)

(58) Field of Classification Search
CPC ..... H01L 31/173; H01L 31/024; H01L 31/12; H01L 31/125; H01L 31/14; H01L 31/143; H01L 31/145; H01L 31/147; H01L 31/153; G01V 8/10
See application file for complete search history.

(56) References Cited

U.S. PATENT DOCUMENTS

| | | | | |
|---|---|---|---|---|
| 2011/0036174 A1* | 2/2011 | Hooper | ................. | B81B 7/0061 73/721 |
| 2013/0139587 A1* | 6/2013 | Le Neel | ............... | G01N 27/223 73/335.04 |
| 2013/0292786 A1* | 11/2013 | Sengupta | ............ | H01L 31/0203 257/432 |

* cited by examiner

*Primary Examiner* — Yosef Gebreyesus
(74) *Attorney, Agent, or Firm* — Seed Intellectual Property Law Group LLP

(57) ABSTRACT

One or more embodiments are directed to system in package (SiP) for optical devices, including proximity sensor packaging. One embodiment is directed to an optical sensor that includes a substrate and a sensor die. A through-hole extends through the substrate, and a trench is formed in a first surface of the substrate and is in fluid communication with the through-hole. The sensor die is attached to the first surface of the substrate and covers the first through-hole and a first portion of the trench. A second portion of the trench is left uncovered by the sensor die.

20 Claims, 7 Drawing Sheets

US 9,793,427 B1

AIR VENTING ON PROXIMITY SENSOR

BACKGROUND

Technical Field

Embodiments of the present disclosure are directed to optical sensors, and more particularly, to proximity sensors.

Description of the Related Art

Optical sensors, such as proximity sensors, are used to detect the presence of and/or distance to nearby objects, and are able to do so without physically touching the object. Optical sensors may be utilized in various electronic devices, such as cameras, phones, including smartphones, vehicles, machinery, and other devices for detecting the presence of and/or distance to nearby objects. After detecting the presence of the nearby object, the electronic device may be configured to perform a function, such as move a mechanical feature to a secure position, transmit an alarm signal, couple or uncouple an electrical communication, or any other desired function.

Optical sensors are provided in packages that typically include a light-emitting device (e.g., a LED), a light-receiving sensor, such as a photodiode, and a processing chip for processing signals received from the light-receiving sensor. The LED, photodiode and processing chip are typically formed on separate dies and packaged together in a sensor package. Generally described, the LED emits radiation out a first opening in the sensor package. When an object is close to the sensor package, a suitable amount of the emitted radiation is reflected off of the object and back toward the sensor package. Some of the reflected radiation enters a second opening in the sensor package proximate the light-receiving sensor or photodiode. The photodiode receives the reflected radiation and generates an electrical signal indicative of the received radiation, which is transmitted to the processing chip for processing, e.g., to determine the presence of and/or distance to the proximate object.

A cap is typically included in conventional optical sensor packages and the cap may include an inner wall that optically separates the light-emitting device and the light-receiving sensor. The cap typically includes two transparent windows, such as glass, with a first window allowing light emitted by the light-emitting device to pass through, and the second window allowing reflected light to pass through to the light-receiving sensor. The windows are attached to the cap.

An air vent is sometimes provided between the window and the cap to allow for venting during assembly of the sensor package. This presents a variety of potential problems. For example, foreign material may be passed through the air vents and into the optical sensor package. Additionally, the airway between the outside environment and an inside portion of the optical sensor package may directly expose optical sensor components (e.g., the light-emitting device, photodiode, sensor die, etc.) to humidity, which may be undesirable and may affect reliability of the sensor. Further, while attaching the glass windows to the cap, glue may overflow or otherwise block the air vent, thereby preventing the air vent from providing a venting path during the assembly process.

BRIEF SUMMARY

One or more embodiments are directed to optical sensor (e.g., proximity sensor) devices and methods including air vent channels formed in the substrate. The air vent channels may be formed by forming one or more through-holes through the substrate, and forming trenches in an upper portion of the substrate (e.g., a solder mask layer) that extend from the through-hole formed in the substrate, below the sensor die, and exit into each of two optically isolated chambers in the sensor device (e.g., a first chamber including a light-emitting device, and a second chamber including a light-receiving sensor). One embodiment is directed to an optical sensor including a substrate having a first surface, a first through-hole extending through the substrate, a trench formed in the first surface of the substrate and in fluid communication with the first through-hole, and a sensor die attached to the first surface of the substrate, the sensor die covering the first through-hole and a first portion of the trench, a second portion of the trench left uncovered by the sensor die.

DETAILED DESCRIPTION

Embodiments are directed to optical sensors and optical sensor packages for optical devices, including proximity sensors and time of flight sensors. The optical sensors include a substrate, a light-emitting device, and a receiving device (e.g., a sensor die) for receiving light emitted from the light-emitting device and reflected by an object toward the receiving device. The receiving device includes receiving circuitry for processing the received light. In that regard, the optical sensor is capable of emitting an optical signal, receiving an optical signal and analyzing electrical signals.

Figure 1A:
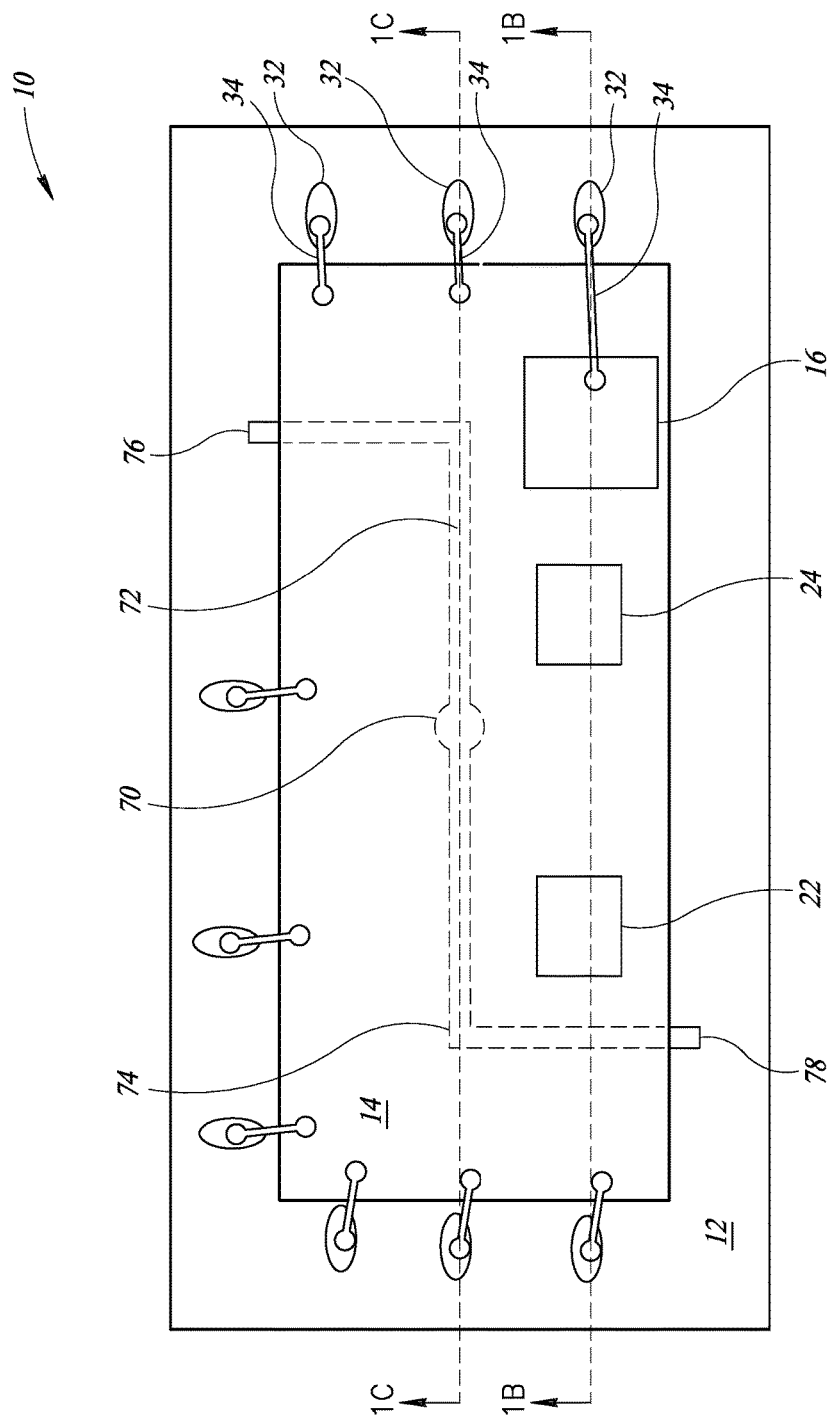
FIG. 1A is a top view of an optical sensor without a cap, in accordance with an embodiment of the present disclosure.
Figure 1B:
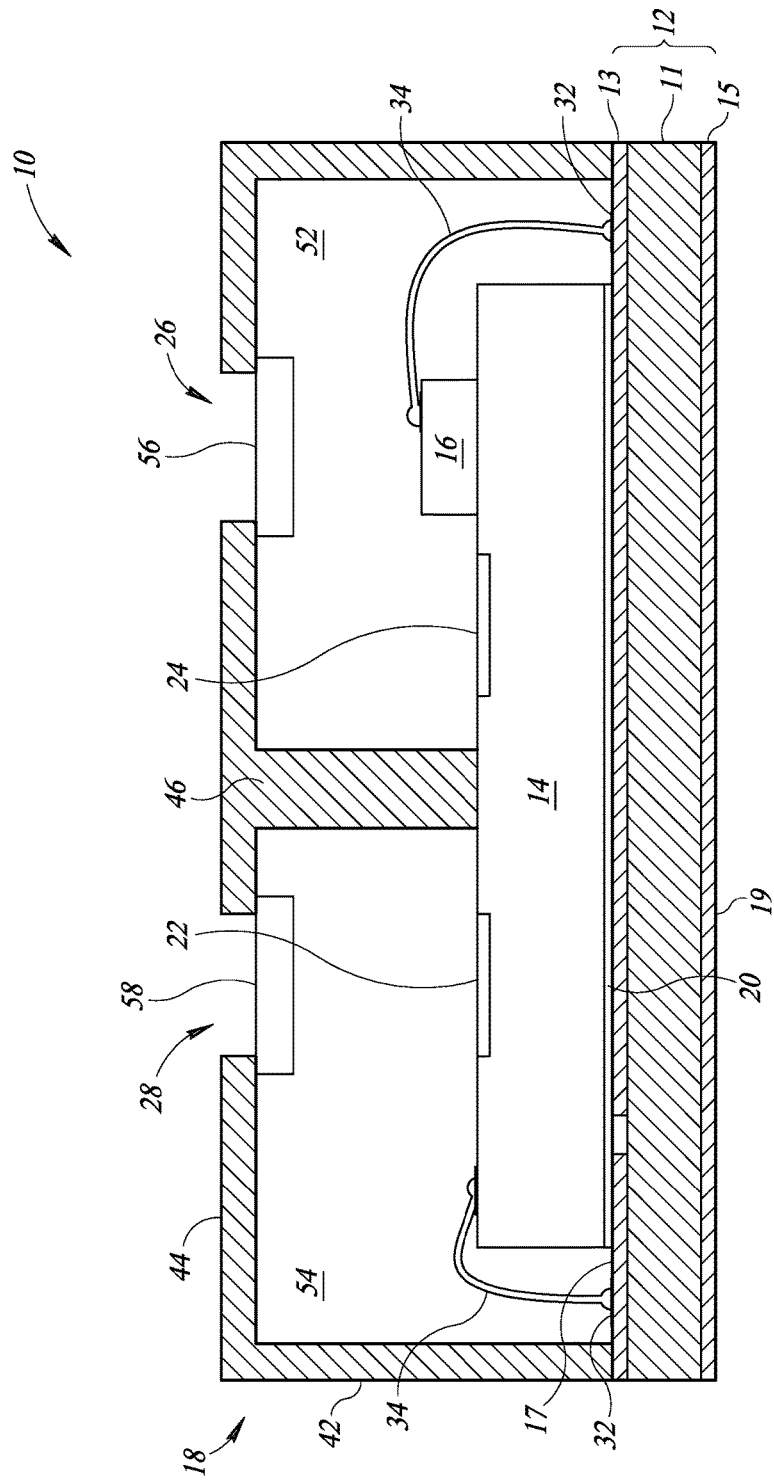
FIG. 1B is a cross-section view of the optical sensor in FIG. 1A, taken along the line 1B, including a cap.
Figure 1C:
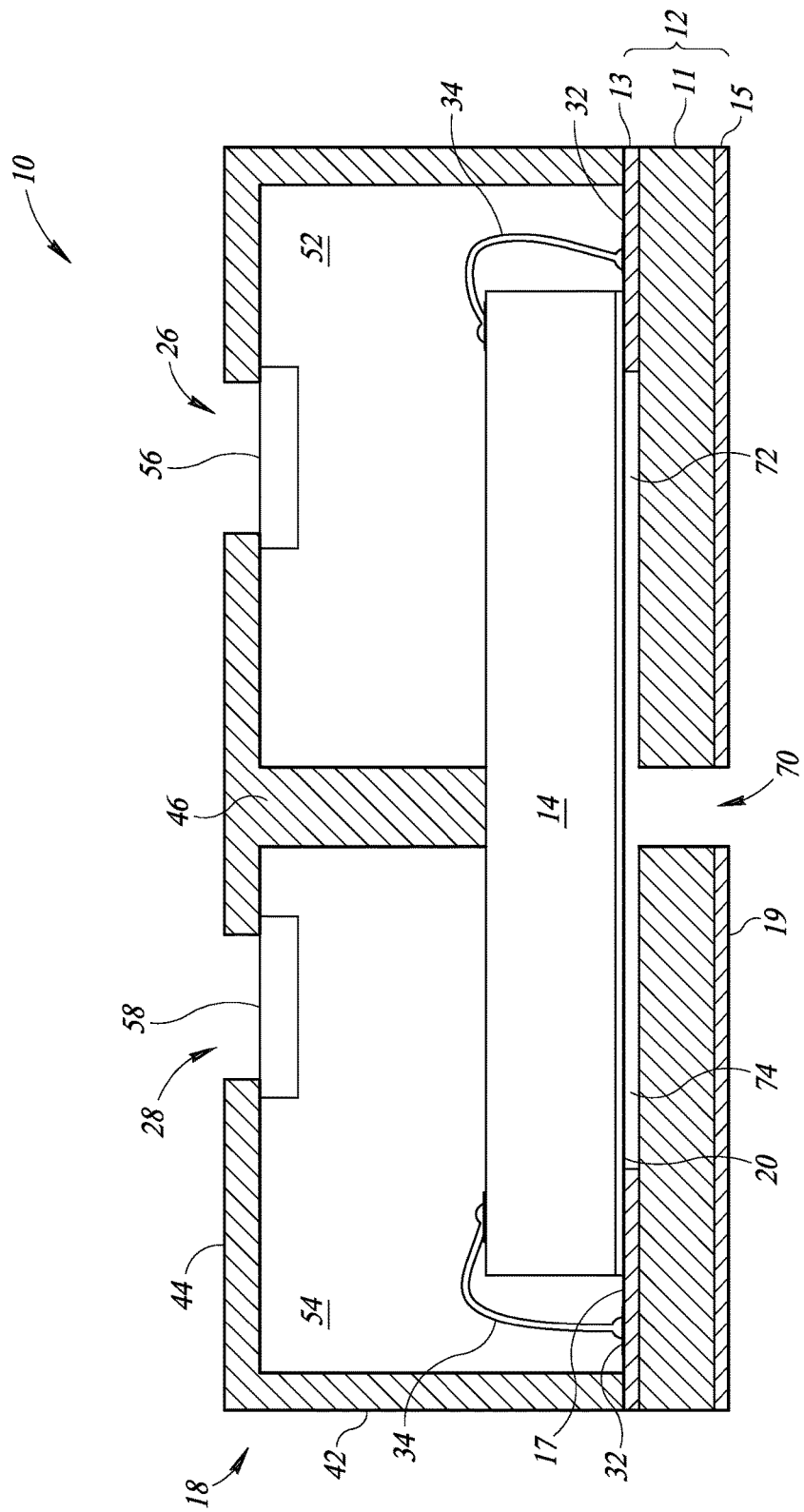
FIG. 1C is a cross-section view of the optical sensor in FIG. 1A, taken along the line 1C, including a cap.

FIG. 1A is a top view of an optical sensor 10 without a cap, according to one or more embodiments of the present disclosure. FIG. 1B is a cross-section view of the optical sensor 10 taken along the line 1B shown in FIG. 1A, and FIG. 1C is a cross-section view of the optical sensor 10 taken along the line 1C shown in FIG. 1A. As best shown in the cross-section view of FIG. 1B, the optical sensor 10 includes a substrate 12, a sensor die 14, a light-emitting device 16, and a cap 18.

Generally described, the substrate 12 includes one or more insulative and conductive layers. The substrate 12 may include a substrate core 11 surrounded by upper and lower outer layers 13, 15. In one or more embodiments, the substrate 12 may be a printed circuit board, and the upper and lower outer layers 13, 15 may be solder mask layers.

A first (e.g., upper) surface 17 of the substrate 12 includes conductive pads 32 and a second (e.g., lower) surface 19 of the substrate 12 includes conductive pads or lands (not shown). The pads 32 on the first surface 17 are in electrical communication with one or more lands on the second surface 19 by conductive traces and/or vias formed in the substrate 12. The second surface 19 of the substrate 12 forms an outer surface of the optical sensor 10 and the lands on the second surface 19 electrically couple the optical sensor 10 to another device or board (not shown). The insulative material isolates various portions of the conductive features therein.

The sensor die 14 is secured to the first surface 17 of the substrate 12, such as by an adhesive material 20. In one embodiment, the adhesive material 20 is double-sided tape or die attach film that secures the sensor die 14 to the substrate 12.

The sensor die 14 is made from a semiconductor material, such as silicon. The sensor die 14 includes an active surface that includes one or more electrical components, such as integrated circuits. The integrated circuits may be analog or digital circuits implemented as active devices, passive devices, conductive layers, and dielectric layers formed within the die and electrically interconnected according to the electrical design and function of the die. In particular, the sensor die 14 includes electrical components that form an Application Specific Integrated Circuit (ASIC). Thus, the sensor die 14 includes circuitry to send, receive, and analyze electrical signals as is well known in the art. In the illustrated embodiment, the active surface is at the upper portion of the sensor die 14.

The light-emitting device 16 may be secured to the upper surface of the sensor die 14 (as shown in FIG. 1B). Alternatively, the light-emitting device 16 may be positioned adjacent to the sensor die 14 and secured to the first (e.g., upper) surface 17 of the substrate 12. The light-emitting device 16 may be secured to the upper surface of the sensor die 14, or to the first surface 17 of the substrate 12, by an adhesive material. The adhesive material may be any material suitable for securing light-emitting device 16 may be secured to the upper surface of the sensor die 14, such as tape, paste, glue, die attach film, or any other suitable material.

The light-emitting device 16 is configured to emit radiation at a particular frequency or frequency range. In one embodiment, the light-emitting device 16 emits infrared (IR) radiation. The light-emitting device 16 may be a vertical cavity surface emitting laser (VCSEL) or a light-emitting diode (LED), e.g., an infrared LED.

The light-emitting device 16 is electrically coupled to the sensor die 14 (e.g., directly electrically coupled to the sensor die 14 and/or indirectly coupled to the sensor die 14 through the substrate 12 as shown in the embodiment of FIG. 1B) and configured to receive electrical signals, such as a power signal from the sensor die 14, and in response to receiving the signal, to emit the radiation at a particular frequency or frequency range. In particular, the sensor die 14 is electrically coupled to the substrate 12 by conductive connectors, which in the illustrated embodiment are conductive wires 34. In that regard, a first end of a conductive wire 34 is coupled to a bond pad on the sensor die 14 and a second end of the conductive wire 34 is coupled to a pad 32 on the first surface 17 of the substrate 12. Similarly, the light-emitting device 16 is electrically coupled to the first surface 17 of the substrate 12 by one or more conductive wires 34. For example, a first end of a conductive wire 34 may be coupled to a bond pad on the light-emitting device 16 and a second end of the conductive wire 34 may be coupled to a pad 32 on the first surface 17 of the substrate 12. In that regard, the light-emitting device 16 may be in electrical communication with the sensor die 14 through the substrate 12.

In another embodiment, the conductive connectors are conductive bumps such that the sensor die 14 and/or light-emitting device 16 are coupled to the substrate 12 by flip chip configuration as is well known in the art.

A return sensor 22 is formed in or otherwise coupled to the upper surface of the sensor die 14. The light-emitting device 16 emits radiation in response to an electrical signal received from the sensor die 14, and the return sensor 22 receives the reflected radiation and provides electrical signals to the sensor die 14 for processing. In one or more embodiments, the return sensor 22 may be or include an array of light sensing elements, such as an array of photo-diodes, an array of single-photon avalanche diodes (SPADs) or the like configured to detect the reflected radiation.

The cap 18 is coupled to the substrate 12 to form one or more cavities for the light-emitting device 16 and sensor die 14. The cap 18 includes sidewalls 42, a cover 44, and an inner wall 46. FIG. 1A illustrates a top down view of the optical sensor 10 without the cap 18, while FIGS. 1B and 1C illustrate cross-section views of the optical sensor 10 with the cap 18. The sidewalls 42 of the cap 18 are secured to the first surface 17 of the substrate 12 to form an upper cavity, and the inner wall 46 of the cap 18 is secured to the upper surface of the sensor die 14, thereby separating the upper cavity into first and second chambers 52, 54. The cap 18 may be secured by an adhesive material, which may be any adhesive material and may be different from or the same as those described above.

The cover 44 of the cap 18 includes a first opening 26, positioned above the light-emitting device 16, to allow radiation emitted from the light-emitting device 16 to exit the first chamber 52 of the optical sensor 10 through the first opening 26. The cover 44 of the cap 18 further includes a second opening 28, positioned above the return sensor 22, to allow reflected radiation to enter the second chamber 54 of the optical sensor 10 and to be received by the return sensor 22.

First and second transparent windows 56, 58 may be optionally be attached to the cap 18 (e.g., to a lower surface of the cover 44, as shown) and may thus form an optically transparent barrier between the first and second openings 26, 28 and the first and second chambers 52, 54, respectively. The first and second transparent windows 56, 58 may be formed of any transparent material, including, for example, glass, and may be secured to the cap 18 by an adhesive material, which may be any adhesive material and may be different from or the same as those described above. The first and second transparent windows 56, 58 may include one or more optical filters for filtering the light that passes therethrough.

In one or more embodiments, the first and second transparent windows 56, 58 are positioned within the spaces forming the first and second openings 26, 28 in the cap 18.

The inner wall 46 of the cap 18 forms a light barrier between the light-emitting device 16 and the return sensor 22. That is, the inner wall 46 of the cap 18 optically isolates the first and second chambers 52, 54 and prevents light emitted from the light-emitting device 16 from being received by the return sensor 22 through the inner wall 46. Instead, the return sensor 22 is optically isolated by the cap 18, except for light that is received through the second opening 28 (and optionally through the second transparent window 58).

In one or more embodiments, the cap 18 may be replaced, for example, by clear or transparent molding over the light-emitting device 16 and the return sensor 22, and an opaque molding surrounding the sensor die 14. In such a case, the clear molding defines first and second light openings through which light emitted by the light-emitting device 16, and light reflected from an object toward the return sensor 22, may pass through.

The optical sensor 10 may further include a reference sensor 24. The reference sensor 24 may be formed in or otherwise coupled to the upper surface of the sensor die 14. The reference sensor 24 is positioned near the light-emitting device 16 and configured to receive a reference light emission, for example, light emitted by the light-emitting device 16 and reflected from a nearby surface having a known distance or optical path length, such as an inner surface of the inner wall 46 of the cap 18, back to the reference sensor 24. In one or more embodiments, the reference sensor 24 may be or include an array of light sensing elements, such as an array of photodiodes, an array of single-photon avalanche diodes (SPADs) or the like.

The ASIC of the sensor die 14 or a separate reference sensor circuit (not shown) formed in the sensor die 14 in the vicinity of the reference sensor 24 is configured to receive and process one or more signals generated by the reference sensor 24 upon receiving the reflected reference light. The sensor die 14 may thus include circuitry to send, receive, and analyze electrical signals received from the return sensor 22 as well as the reference sensor 24, as is well known in the art.

In operation, the ASIC of the sensor die 14 is configured to cause the light-emitting device 16 to emit light through the first opening 26. The light is reflected by a nearby object and travels through the second opening 28 and the return sensor 22 receives the light. The ASIC of the sensor die 14 receives the signals from the return sensor 22 and is configured to process signals generated by the return sensor 22 upon receiving the reflected light.

FIG. 1C is a cross-section view taken along a center line (line 1C) as shown in the top view of FIG. 1A. As can be seen in dashed lines of FIG. 1A and more clearly in the cross-section view of FIG. 1C, the optical sensor 10 includes a through-hole 70 extending all the way through the substrate 12. A first air vent channel 72 is coupled between, and in fluid communication with, the through-hole 70 and a first air vent 76. A second air vent channel 74 is coupled between, and in fluid communication with, the through-hole 70 and a second air vent 78. The first air vent 76 as shown in solid lines in FIG. 1A extends beyond the sensor die 14 and is in fluid communication with the first chamber 52, and the second air vent 78 as shown in solid lines in FIG. 1A extends beyond the sensor die 14 and is in fluid communication with the second chamber 54. Accordingly, air can be freely vented from outside the substrate 12 (e.g., via the through-hole 70) to the first and second chambers 52, 54, and conversely, from the first and second chambers 52, 54 through the through-hole 70 and outside of the substrate 12. This is particularly advantageous for allowing air to flow during thermal exposure of the optical sensor 10, which may be encountered during the assembly process, for example, during an attaching and/or curing process for securing the cap 18 to the substrate 12, for securing the first and second transparent windows 56, 58 to the cap 18, during a flip-chip or solder reflow process for securing the optical sensor 10 to another board or device, or the like.

Additionally, it will be readily appreciated that the through-hole 70 may be closed or filled after the optical sensor 10 has been assembled, for instance, after the optical sensor has been subjected to processing including thermal exposure, such as gluing or curing (e.g., during attachment of the cap 18), a solder reflow process (e.g., to secure the light-emitting device 16 to the sensor die 14, or to secure the optical sensor 10 to another circuit board or device), or the like, thereby providing even better protection in terms of foreign material and humidity exposure of the components within the optical sensor 10.

As shown in FIG. 1C, the first and second air vent channels 72, 74 may be formed between the upper surface of the substrate 12 and a lower surface of the sensor die 14 once attached to the substrate 12 (e.g., via an adhesive material 20, such as a die attach film). The first and second air vent channels 72, 74 may be formed by removing a portion of the upper outer layer 13 (e.g., an upper solder mask layer) of the substrate 12, thereby defining bottom and sidewalls of the air vent channels 72, 74, and then by attaching the sensor die 14 to the substrate 12, thereby defining a top wall of the air vent channels 72, 74.

Similarly, the first and second air vents 76, 78 may be formed in the upper outer layer 13 of the substrate 12, and may be portions of the first and second air vent channels 72, 74 that extend into the first and second chambers 52, 54 (e.g., by extending beyond the periphery of the sensor die 14 into the first and second chambers 52, 54).

Figure 2:
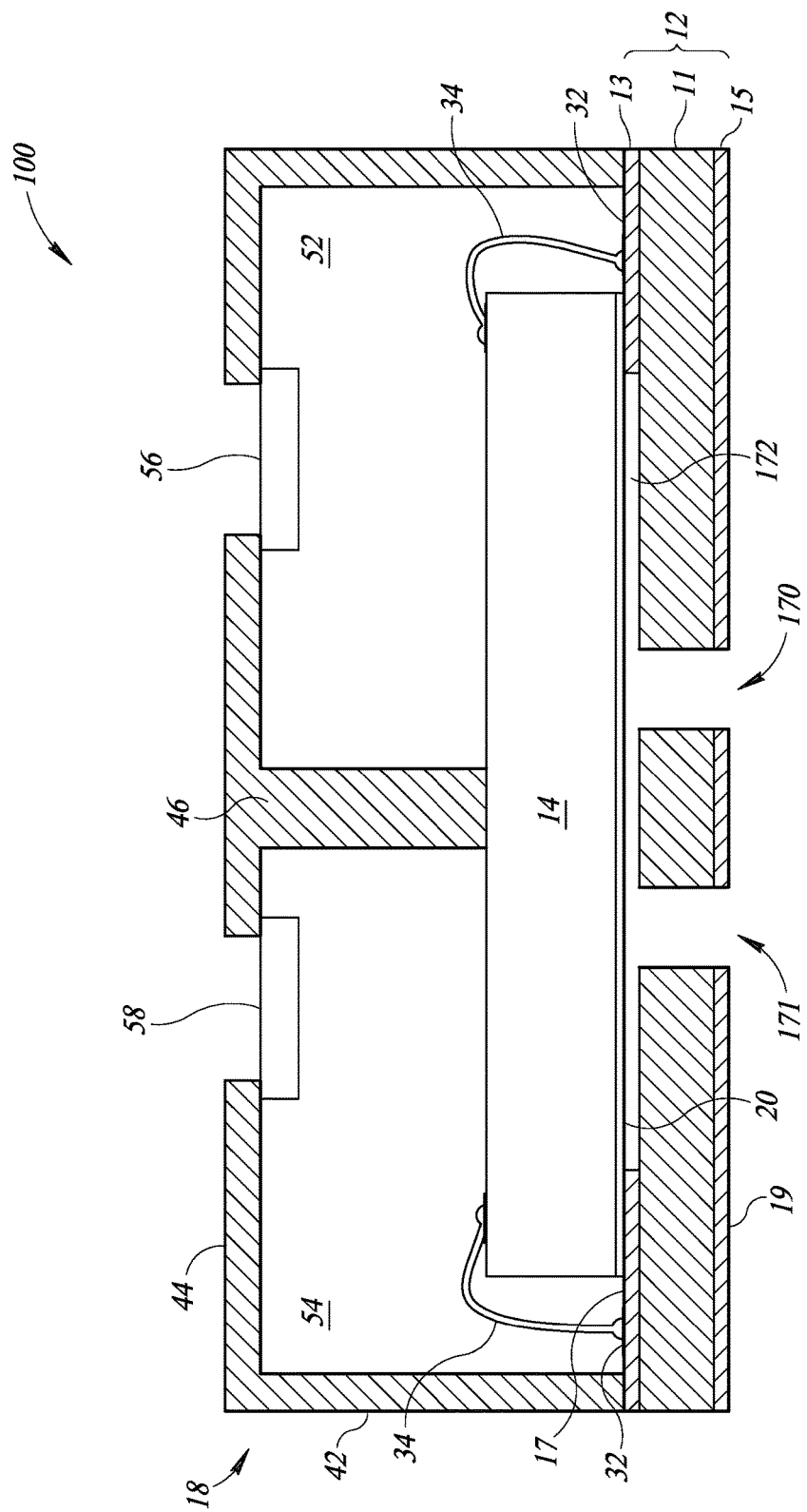
FIG. 2 is a cross-section view of an optical sensor including two through-holes extending through the substrate, in accordance with another embodiment.

While the optical sensor 10 is shown in FIGS. 1A-C as including a single through-hole 70 and two air vents 76, 78, it will be readily appreciated that the optical sensor 10 may include a substrate having any number of through-holes for venting air into or from any number of air vent channels and any number of air vents to vent air into or from the first and second chambers. For example, FIG. 2 is a cross-section view of an optical sensor 100 (having a view similar to that of FIG. 1C, i.e., taken along a similar center-line of the optical sensor 100) according to another exemplary embodiment of the present disclosure. The optical sensor 100 of FIG. 2 is similar in structure and function to the optical sensor 10 of FIGS. 1A-1C except for the difference that will be discussed below. The features shared by the optical sensors 10 and 100 will not be described here again in the interest of brevity.

The difference between the optical sensor 100 shown in FIG. 2 and the optical sensor 10 shown in FIGS. 1A-1C is that the optical sensor 100 includes two through-holes 170, 171 extending through the substrate 12. The through-holes 170, 171 are shown being in fluid communication with a single air vent channel 172. However, it will be readily appreciated that two or more separate air vent channels may be included in the optical sensor 10 and in fluid communication with one or both of the through-holes 170, 171. For example, each through-hole 170, 171 may be in fluid communication with a particular air vent channel, with each air vent channel being in fluid communication with one or more air vents for venting air to and from the first and second chambers of the optical sensor 100.

Figure 3A:
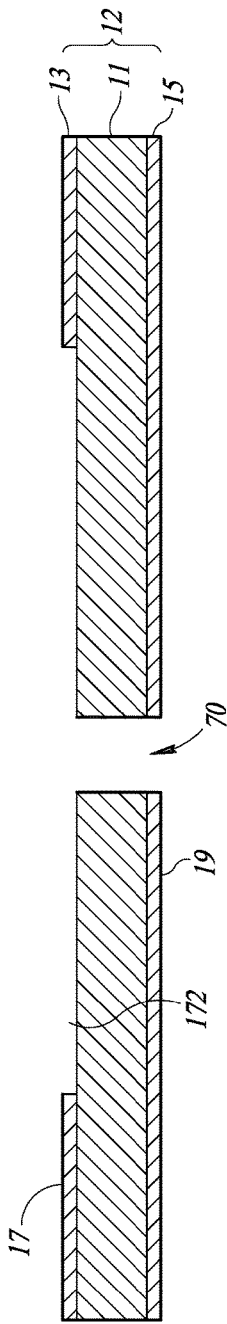
FIGS. 3A through 3C are cross-section views illustrating a method of forming the optical sensor shown in FIGS. 1A-1C, in accordance with embodiments of the present disclosure.
Figure 3B:
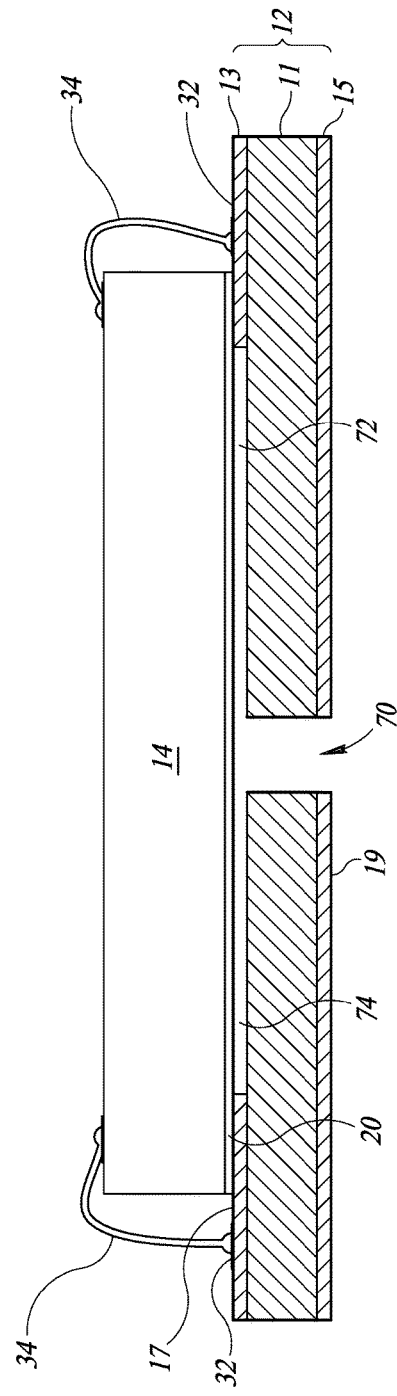
Figure 3C:
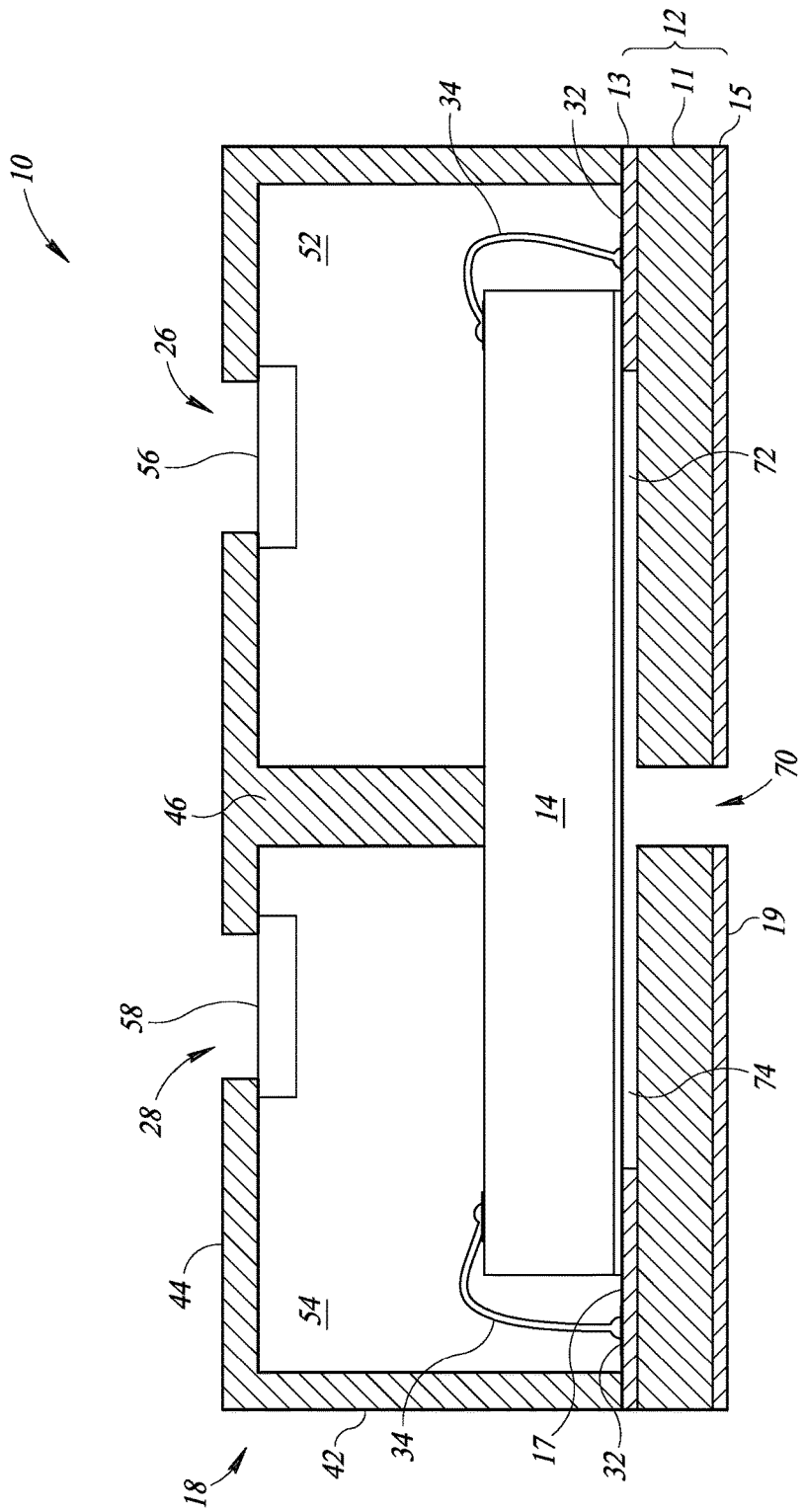

FIGS. 3A-3C are cross-section views (e.g., taken along the center-line 1C shown in FIG. 1A) illustrating a method of making the optical sensor 10 of FIGS. 1A-1C according to one embodiment. As shown in FIG. 3A a trench 172 is formed in the first (e.g., upper) surface 17 of the substrate 12. The trench 172 may be formed in the upper outer layer 13 of the substrate 12, which as indicated above may be a solder mask layer. Although not shown, the trench 172 has the shape of first and second air vent channels 72 and 74 and first and second air vents 76 and 78. In that regard, the left side of the trench 172 in FIG. 3A also extends in a direction that is out of the page and the right side of the trench 172 also extends in a direction that is into the page.

The trench 172 may be formed by any method for forming a trench, including etching and cutting. In one embodiment, the trench 172 is formed as a through opening in the solder mask layer prior to coupling the solder mask layer to the substrate core 11. In another embodiment, the trench 172 is formed after the solder mask layer is on the core material 11. The trench 172 may extend through the entire thickness of the upper outer layer 13 as shown in FIG. 3A or extend through a portion of the thickness of the upper outer layer 13.

Further, as shown in FIG. 3A, a through-hole 70 is formed through the substrate 12, and in fluid communication with the trench 172. The through-hole 70 may be formed by any method for forming a through hole in the substrate 12, for example, by etching, punching, drilling, or the like, through the substrate 12. The through-hole 70 is in fluid communication with the trench 172 and may be formed at a position centered about, and cutting through, the trench 172. While FIG. 3A depicts the formation of a single trench and a single through-hole 70, as discussed herein, two or more through-holes may be formed through the substrate 12 (as shown, for example, in FIG. 2) and two or more trenches may be formed in the substrate 12.

As shown in FIG. 3B, a sensor die 14 is attached to the first surface 17 of the substrate 12 over at least a portion of the trench 172, but with ends of the trench 172 exposed from the sensor die 14. That is, by attaching the sensor die 14 to the substrate 12, the sensor die 14 forms a cover over the trench 172, thereby defining the first and second air vent channels 72, 74. In the illustrated embodiment, a portion of the trench 172 is left uncovered, which forms the first and second air vents 76, 78 after the sensor die 14 is secured to the substrate 12.

The sensor die 14 may be attached to the substrate 12 using an adhesive material 20 with suitable structure that does not flow into the trench 172 and the through-hole 70. For instance, double-sided tape or die attach film is applied to at least one of a lower surface of the sensor die 14 and a bottom surface of the sensor die 14.

The light-emitting device 16 is coupled to the upper surface of the sensor die 14 (as can be seen, for example, in the cross-section view of FIG. 1B). It is to be appreciated that the light-emitting device 16 may be electrically coupled to the upper surface of the sensor die 14 before or after attaching the sensor die 14 to the substrate 12.

The sensor die 14 and the light-emitting device 16 are electrically coupled to the first surface 17 of the substrate 12. In the illustrated embodiment, electrical coupling is completed by coupling a first end of a conductive wire 34 to a pad of the sensor die 14 and a second end of the conductive wire 34 to a pad 32 of the substrate 12. It is to be appreciated that electrical coupling and mechanical coupling may alternatively be provided in one or more embodiments by a flip chip process, for example, by reflowing solder balls between the lower surface of the sensor die 14 and pads 32 on the first (i.e., upper) surface 17 of the substrate 12.

As shown in FIG. 3C, the cap 18 is secured to the first (i.e., upper) surface 17 of the substrate 12, with the sidewalls 42 positioned outward of the sensor die 14 and the conductive wires 34. The inner wall 46 of the cap 18 is secured to the upper surface of the sensor die 14. Adhesive material is provided on at least one of the cap 18 and the surfaces of the sensor die 14 and the substrate 12 prior to coupling them together.

The first and second transparent windows 56, 58 may be coupled to the cap 18 prior to securing the cap 18 to the substrate 12 (e.g., the first and second transparent windows 56, 58 may be attached below or within the first and second openings 26, 28 before securing the cap 18 to the substrate 12). Alternatively, in one or more embodiments, the cap 18 may be secured to the substrate 12 and/or the sensor die 14 to form the first and second openings 26, 28, without including the first or second transparent windows 56, 58. In yet another embodiment, the first and second transparent windows 56, 58 are coupled to an outer surface of the cap 18 after the cap is secured to the substrate 12.

Figure 4:
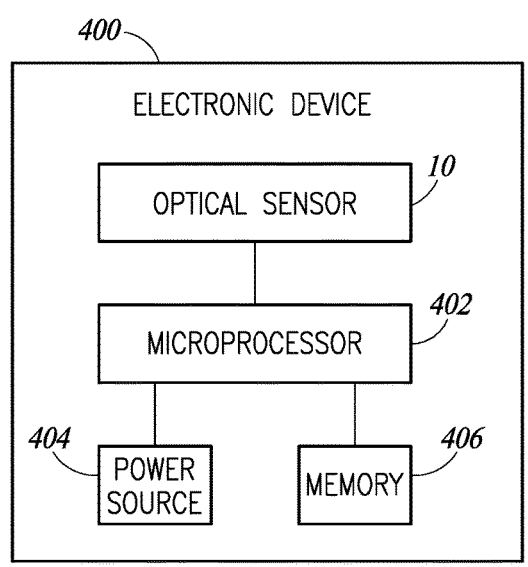
FIG. 4 is a block diagram illustrating an electronic device including an optical sensor, in accordance with embodiments of the present disclosure.

FIG. 4 shows an electronic device 400 including an optical sensor described herein, such as the optical sensor 10 or the optical sensor 100, coupled to a microprocessor 402. The microprocessor 402 may be any circuit configured to receive or send electrical signals to the optical sensor package 10 or 100. The electronic device 400 may further include a power source 404 configured to provide electric power for the device. The power source 404, which may be a battery or components for coupling to an external power source, may be coupled to the microprocessor 402. The electric device 400 may also include a memory 406 coupled to or incorporated in the microprocessor 402.

In one or more embodiments, the electronic device 400 may be a cell phone, smartphone, tablet, camera, and/or wearable computing device that may be located in clothing, shoes, watches, glasses or any other wearable structures. In some embodiments, the electronic device 400, or the optical sensor 10 itself, may be located in a vehicle, such as boat and car, a robot, or any other moveable structure or machinery.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An optical sensor comprising:
   a substrate having a first surface;
   a first through-hole extending through the substrate;
   a trench formed in the first surface of the substrate and in fluid communication with the first through-hole; and
   a sensor die attached to the first surface of the substrate, the sensor die covering the first through-hole and a first portion of the trench, a second portion of the trench left uncovered by the sensor die.

2. The optical sensor of claim 1, wherein the substrate includes a solder mask layer, the trench being formed in the solder mask layer.

3. The optical sensor of claim 1, further comprising a light-emitting device coupled to the substrate.

4. The optical sensor of claim 3, wherein the light-emitting device is attached to a top surface of the sensor die.

5. The optical sensor of claim 3, further comprising a cap positioned around side surfaces of the sensor die and covering at least a portion of the sensor die, the cap having sidewalls and an inner wall, the inner wall optically separating the light-emitting device from a return sensor region of the sensor die.

6. The optical sensor of claim 5, wherein the cap defines portions of a first chamber and a second chamber, the first and second chambers being separated by the inner wall.

7. The optical sensor of claim 5, wherein the second portion of the trench includes first and second air vents, the first air vent being positioned in the first chamber, the second air vent being positioned in the second chamber.

8. The optical sensor of claim 1, wherein the sensor die is attached to the substrate by a die attach film.

9. The optical sensor of claim 1, further comprising a second through-hole extending through the substrate and in fluid communication with the trench, the second through-hole being covered by the sensor die.

10. A method comprising:
forming a vent path that includes a trench at a first surface of a substrate and a through-hole through the substrate;
attaching a sensor die to the first surface of the substrate, the sensor die covering a first portion of the trench, a second portion of the trench being left uncovered by the sensor die;
electrically coupling the sensor die to the substrate; and
coupling a cap to the substrate to form at least one chamber, the second portion of the trench being in fluid communication with the at least one chamber.

11. The method of claim 10, the substrate including a solder mask layer, wherein forming the trench includes forming the trench in the solder mask layer.

12. The method of claim 10, further comprising:
attaching a light-emitting device to the sensor die; and
electrically coupling the light-emitting device to the substrate.

13. The method of claim 12, wherein coupling the cap to the substrate comprises coupling sidewalls of the cap to the substrate, the cap including an inner wall such that the at least one chamber includes first and second chambers, the inner wall optically separating the light-emitting device in the first chamber from a return sensor region of the sensor die in the second chamber.

14. The method of claim 13, wherein the second portion of the trench includes first and second air vents, the first air vent being positioned in the first chamber, the second air vent being positioned in the second chamber.

15. The method of claim 10, wherein attaching a sensor die to the first surface of the substrate includes attaching the sensor die to the first surface of the substrate with a die attach film.

16. The method of claim 10, further comprising:
forming a second through-hole through the substrate and in fluid communication with the trench.

17. An electronic device comprising:
a microprocessor; and
an optical sensor package coupled to the microprocessor, the optical sensor package including:
a substrate having a first surface;
a first through-hole extending through the substrate;
a trench formed in the first surface of the substrate and in fluid communication with the first through-hole; and
a sensor die attached to the first surface of the substrate, the sensor die covering the first through-hole and a first portion of the trench, a second portion of the trench left uncovered by the sensor die.

18. The electronic device of claim 17, the optical sensor package further comprising a cap positioned around side surfaces of the sensor die and covering at least a portion of the sensor die, the cap having sidewalls and an inner wall, the inner wall optically separating the light-emitting device from a return sensor region of the sensor die.

19. The electronic device of claim 18, wherein the cap defines portions of a first chamber and a second chamber, the first and second chambers being separated by the inner wall, wherein the second portion of the trench includes first and second air vents, the first air vent being positioned in the first chamber, the second air vent being positioned in the second chamber.

20. The electronic device of claim 17, wherein the electronic device is at least one of a cell phone, smartphone, tablet, camera, and a wearable computing device.

* * * * *